(12) United States Patent
Halter

(10) Patent No.: US 6,434,203 B1
(45) Date of Patent: Aug. 13, 2002

(54) MEMORY ARCHITECTURE FOR MAP DECODER

(75) Inventor: Steven J. Halter, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/283,013

(22) Filed: Mar. 31, 1999

Related U.S. Application Data (60) Provisional application No. 09/259,665, filed on Feb. 26, 1999.

(51) Int. Cl.[7] .............................. H03D 1/00; H04L 27/06
(52) U.S. Cl. .......................... 375/341; 375/262; 714/794
(58) Field of Search ................................. 375/340, 341, 375/262, 265; 714/758, 752, 776, 786, 794, 795

(56) References Cited

U.S. PATENT DOCUMENTS

| | | | |
|---|---|---|---|
| 6,145,114 A | * 11/2000 | Crozier et al. | 714/794 |
| 6,182,261 B1 | * 1/2001 | Haller et al. | 714/758 |
| 6,189,126 B1 | * 2/2001 | Ulmer et al. | 714/795 |
| 6,272,183 B1 | * 8/2001 | Berens et al. | 375/262 |

FOREIGN PATENT DOCUMENTS

WO      9724850      7/1997      ........... H04L/27/06

* cited by examiner

Primary Examiner—Chi Pham
Assistant Examiner—Phuong Phu
(74) Attorney, Agent, or Firm—Philip R. Wadsworth; Charles D. Brown; Howard H. Seo (57) ABSTRACT

The present invention is a novel and improved technique for decoding technique with particular application to turbo, or iterative, coding techniques. In accordance with one embodiment of the invention, a system for decoding includes a channel deinterleaver RAM for storing a block of symbol estimates, a set of S state metric calculators. Each state metric calculator is for generating a set of state metric calculations and a set of S+1 window RAMs, wherein, S of said S+1 window RAMs provide symbol estimates to said S state metric calculators. A remaining window RAM receives symbol estimates from said channel deinterleaver RAM.

15 Claims, 7 Drawing Sheets

MEMORY ARCHITECTURE FOR MAP DECODER

CROSS REFERENCE TO RELATED APPLICATIONS

This application claims priority under the benefit of U.S.C. Section 120 to co-pending patent application Ser. No. 09/259,665, filed on Feb. 26, 1999, and entitled "Partitioned Interleaver Memory For Map Decoder", and said application is incorporated herein by reference.

BACKGROUND OF THE INVENTION

I. Field of the Invention

The present invention relates to coding. More particularly, the present invention relates to a novel and improved technique for performing maximum a posteriori probability (MAP) decoding.

II. Description of the Related Art

"Turbo coding" represents an important advancement in the area of forward error correction (FEC). There are many variants of turbo coding, but most use multiple encoding steps separated by interleaving steps combined with iterative decoding. This combination provides previously unavailable performance with respect to noise tolerance in a communications system. That is, turbo coding allows communications at $E_b/N_O$ levels that were previously unacceptable using the existing forward error correction techniques.

Many systems use forward error correction techniques, and therefore would benefit from the use of turbo coding. For example, turbo codes could improve the performance of wireless satellite links, where the limited downlink transmit power of the satellite necessitates receiver systems that can operate at low $E_b/N_O$ levels. Using turbo codes in a wireless satellite link could reduce the dish size for a digital video broadcast (DVB) system, or alternatively, allow more data to be transmitted within a given frequency bandwidth.

Digital wireless telecommunication systems, such as digital cellular and PCS telephone systems, also use forward error correction. For example, the IS-95 over-the-air interface standard, and its derivatives, such as IS-95B, define a digital wireless communications system that uses convolutional encoding to provide coding gain to increase the capacity of the system. A system and method for processing RF signals substantially in accordance with the use of the IS-95 standard is described in U.S. Pat. No. 5,103,459 entitled "System and Method for Generating Signal Waveforms in a CDMA Cellular Telephone System" assigned to the assignee of the present invention and incorporated herein by reference ('459 patent).

Because digital wireless communication system like IS-95 are primarily for mobile communications, it is important to have devices that minimize power usage and which are small and light. Typically, this requires development of a semiconductor integrated circuit ("chip") for performing most or all of the necessary processing. While convolutional encoding is relatively complex, the circuits necessary to perform convolutional encoding and decoding can be formed on a single chip along with any other necessary circuitry.

Turbo coding (in particular the decoding operation) is significantly more complex than convolutional encoding (and decoding). Nonetheless, it would be highly desirable to include turbo coding in digital wireless telecommunication systems, including mobile digital communication systems and satellite communication system. Thus, the present invention is directed to increasing the rate at which certain decoding operations can be performed, to facilitate the use of turbo coding in a variety of systems.

SUMMARY OF THE INVENTION

The present invention is a novel and improved technique for decoding technique with particular application to turbo, or iterative, coding techniques.

In accordance with one embodiment of the invention, a system for decoding includes a channel deinterleaver RAM for storing a block of symbol estimates, a set of S state metric calculators. Each state metric calculator is for generating a set of state metric calculations and a set of S+1 window RAMs, wherein, S of said S+1 window RAMs provide symbol estimates to said S state metric calculators. A remaining window RAM receives symbol estimates from said channel deinterleaver RAM.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a novel and improved technique for performing turbo coding. The exemplary embodiment is described in the context of the digital cellular telephone system. While use within this context is advantageous, different embodiments of the invention may be incorporated in different environments, configurations or digital data transmission systems, including satellite communication systems and wire line communication system such as digital cable and telephone systems.

In general, the various systems described herein may be formed using software controlled processors, integrated circuits, or discrete logic, however, implementation in an integrated circuit is preferred. The data, instructions, commands, information, signals, symbols and chips that may be referenced throughout the application are advantageously represented by voltages, currents, electromagnetic waves, magnetic fields or particles, optical fields or particles, or a combination thereof. In addition, the blocks shown in each block diagram may represent either hardware or method steps.

Figure 1A:
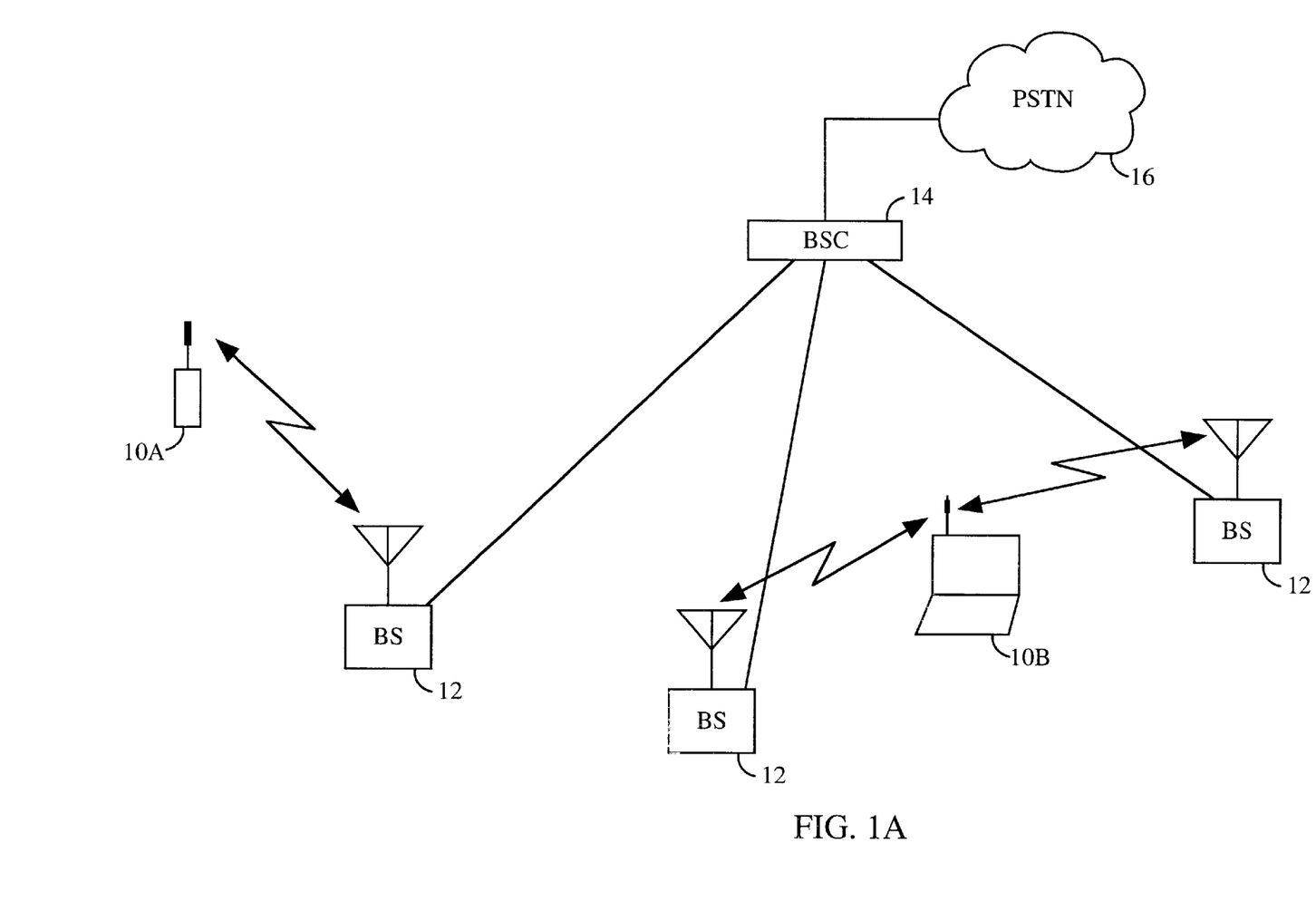
FIGS. 1A and 1B are block diagrams of wireless communication systems.

FIG. 1A is a highly simplified diagram of a cellular telephone system configured in accordance with one embodiment of the invention. To conduct telephone calls or other communications, subscriber units 10 interface with base stations 12 via RF signals. Base stations 12 interface with the public switch telephone network via base station controller (BSC) 14.

Figure 1B:
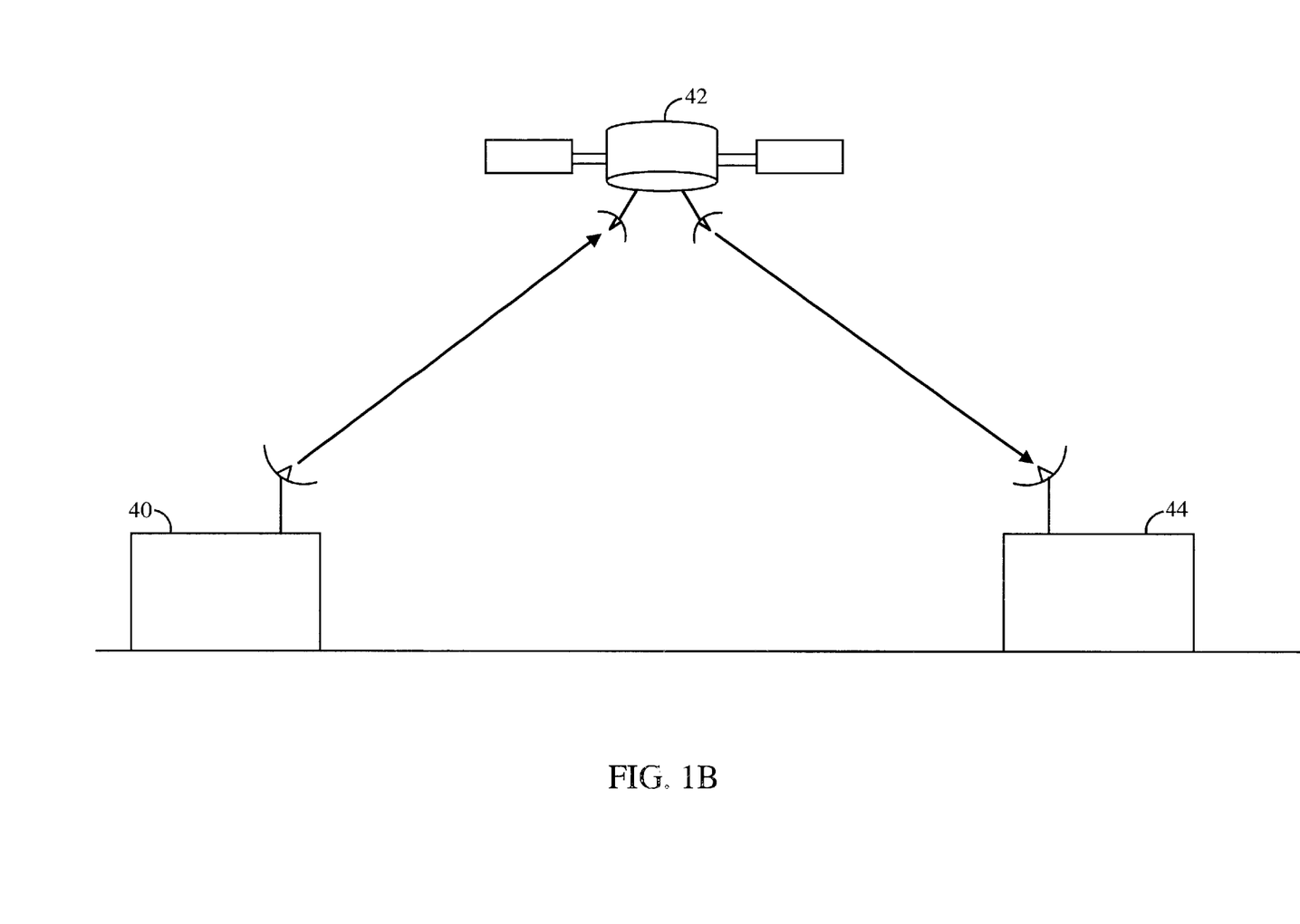

FIG. 1B is a highly simplified diagram of a satellite communications system configured in accordance with another embodiment of the invention. Uplink station 40 transmits RF signals containing information such as video programming to satellite 42. Satellite 42 relays the RF signals back to earth where receiver 44 converts the receive RF signals into digital data.

Figure 2:
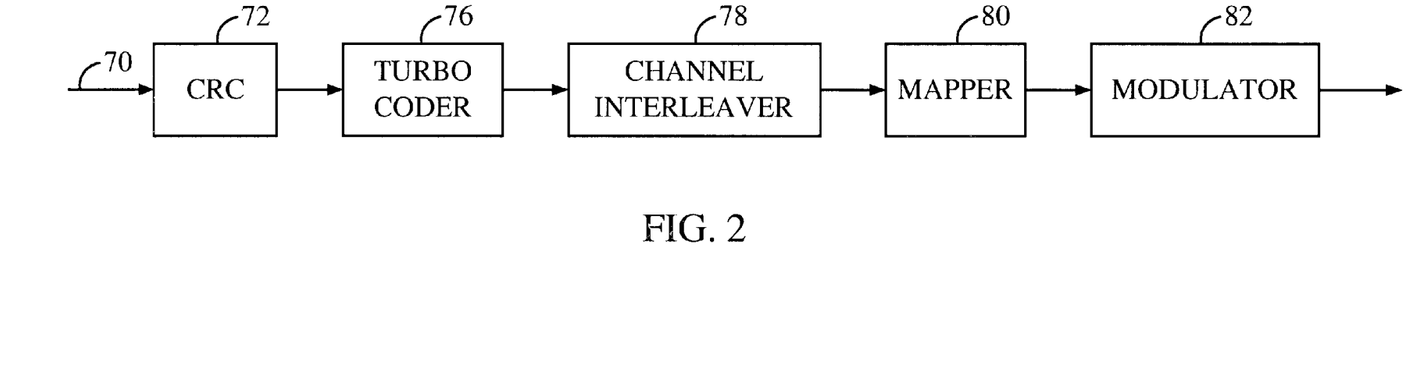
FIG. 2 is a block diagram of an transmit system.

FIG. 2 is a block diagram of an exemplary transmit system configured in accordance with the use of one embodiment present invention. The transmit system can be used within a subscriber unit 10, a base stations 12, or uplink station 40, as well as any other system that generates digital signals for transmission. The transmit processing shown represent just one possible embodiment of the invention, as numerous other transmit processing schemes may incorporate and benefit from the use of various embodiments of the invention.

Data 70 is supplied to CRC generator 72 which generates CRC checksum data for a given each predetermined amount of data received. The resulting data blocks are supplied to turbo coder 76 which generates code symbols that are supplied to channel interleaver 78. The code symbols typically include a retransmission of the original data (the systematic symbol), and one or more parity symbols.

The number of parity symbols transmitted for each systematic symbol depends on the coding rate. For a coding rate of ½ one parity symbol is transmitted for every systematic symbol, for a total of two symbols generated for each data bit (including CRC) received. For a rate ⅓ turbo coder, two parity symbols are generated for each systemic symbol, for a total of three symbols generated for each data bit received.

The code symbols from the turbo coder 76 are supplied to channel interleaver 78. Channel interleaver 78 performs interleaving on blocks the symbols as they are received, outputting interleaved symbols that are received by mapper 80. Typically, channel interleaver 78 performs block or bit-reversal interleaving, virtually all other types of interleavers many be used as the channel interleaver.

Mapper 80 takes the interleaved code symbols and generates symbol words of certain bit width based on a predetermined mapping scheme. The symbol words are then applied to modulator 82 which generates a modulated wave form based on the symbol word received. Typical modulation techniques include QPSK, 8-PSK, and 16 QAM, although various other modulation schemes may be utilized. The modulated waveform is then upconverted for transmission at an RF frequency.

Figure 3A:
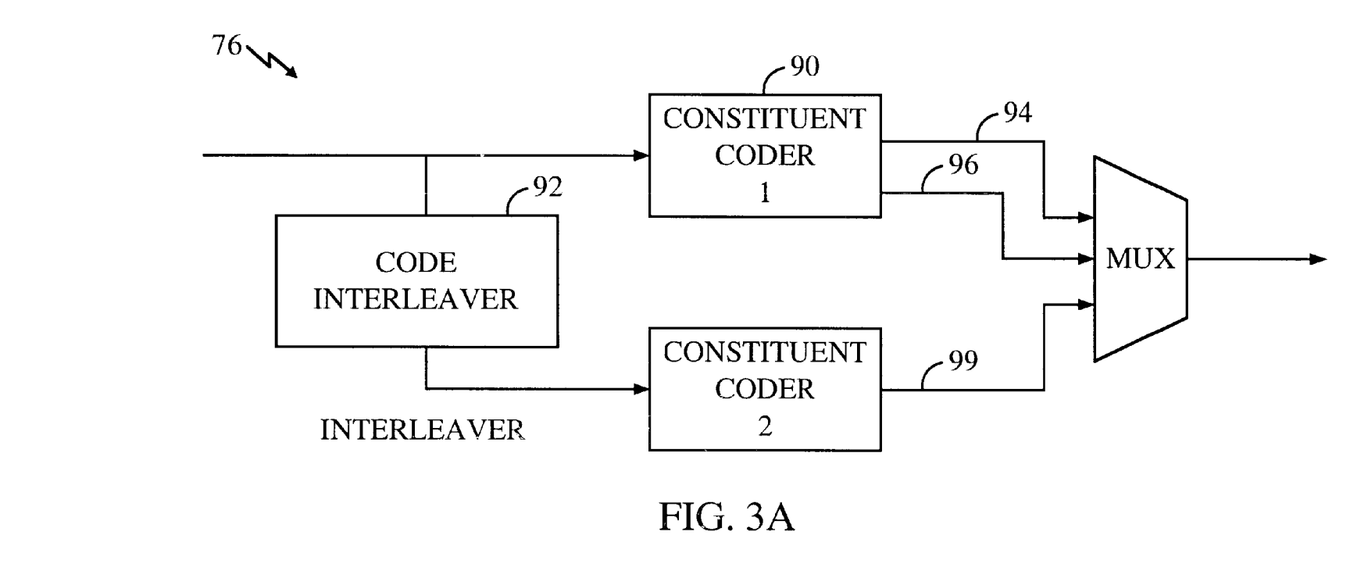
FIGS. 3A and 3B are diagrams of turbo coders.

FIG. 3A is a block diagram of a turbo coder configured in accordance with a first embodiment of the invention. In this first embodiment of the invention, the turbo coder is configured as a parallel concatenated turbo coder. Within the version of the turbo coder 76, constituent coder 90 and code interleaver 92 receive the data from CRC generator 72, which as described above output the input data and CRC checksum bits. Constituent coder 90 also generates tail bits to provide a known state at the end of each frame.

As is well known, code interleaver 92 should be a highly randomized interleaver for the best performance. An interleaver that provides excellent performance with minimal complexity as a code interleaver is described in copending U.S. patent application Ser. No. 09/158,459 filed Sep. 22, 1998 entitled "Coding System Having State Machine Based Interleaver", and co-pending Continuation-In-Part application Ser. No. 09/172,069, filed Oct. 13, 1998 entitled "Coding System Having State Machine Based Interleaver", and U.S. Pat. No. 6,304,991 entitled "Turbo Code Interleaver Using Linear Cogruential Sequence", all assigned to the assignee of the present application and incorporated herein by reference. Constituent coder 90 outputs systematic symbols 94 (typically a copy of the original input bits) and parity symbols 96. Constituent coder 98 receives the interleaved output of code interleaver 92 and outputs additional parity symbols 99. Constituent coder 90 may also adds tail bits to provide a known state at the end of each frame.

The outputs of constituent coder 90 and constituent coder 98 are muxed into the output data stream for a total coding rate R of ⅓. Additional constituent codes and code interleaver pairs may be added to reduce the coding rate for increased forward error correction. Alternatively, some of the parity symbols 96 and 99 may be punctured (not transmitted) to increase the coding rate. For example, the coding rate could be increased to ½ by puncturing every other parity symbol 96 and 99, or not transmitting parity symbol 96 at all.

Constituent coders 90 and 98 may be various types of coders including block coders or convolutional coders. As convolutional coders, constituent coders 90 and 98 typically have a small constraint length such as 4 (four) to reduce complexity, and are recursive systematic convolutional (RSC) encoders. The lower constraint length reduces the complexity of the corresponding decoder at the receive system.

Typically, the two coders output one systematic symbol and one parity symbol for each bit received for a constituent coding rate R=½. The total coding rate for the turbo coder of FIG. 1A is R=⅓, however, because the systematic bit from constituent coder 98 is not used. As noted above, additional interleaver and coder pairs may also be added in parallel to reduce the coding rate, and therefore provide higher error correction, or puncturing can be performed to increase the coding rate.

Figure 3B:
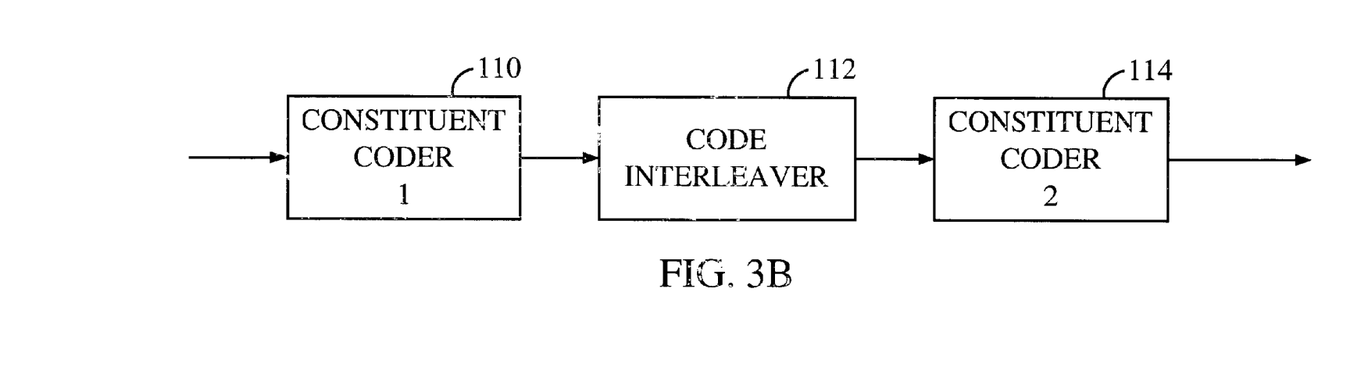

FIG. 3B depicts turbo coder 76 as a serial concatenated turbo coder in accordance with an alternative embodiment of the invention. Within the turbo coder of FIG. 3B, the data from CRC generator 72 is received by constituent coder 110 and the resulting code symbols are applied to code interleaver 112. The resulting interleaved parity symbols are supplied to constituent coder 114, which performs additional encoding to generate parity symbols 115. Typically, constituent coder 110 (the outer coder) may be various types of encoders including block encoders or convolutional encoders, but constituent coder 114 (the inner coder) is preferably a recursive coder and is typically a recursive systematic encoder.

As recursive systematic convolutional (RSC) encoders, constituent coders 110 and 114 generate symbols at a coding rate R<1. That is, for a given number of input bits N, M output symbols are generated where M>N. The total coding rate for the serial concatenated turbo coder of FIG. 1B is the coding rate of constituent coder 110 multiplied by the coding rate of constituent coder 114. Additional interleaver and coder pairs may also be added in series to reduce the coding rate and therefore provide additional error protection.

Figure 4:
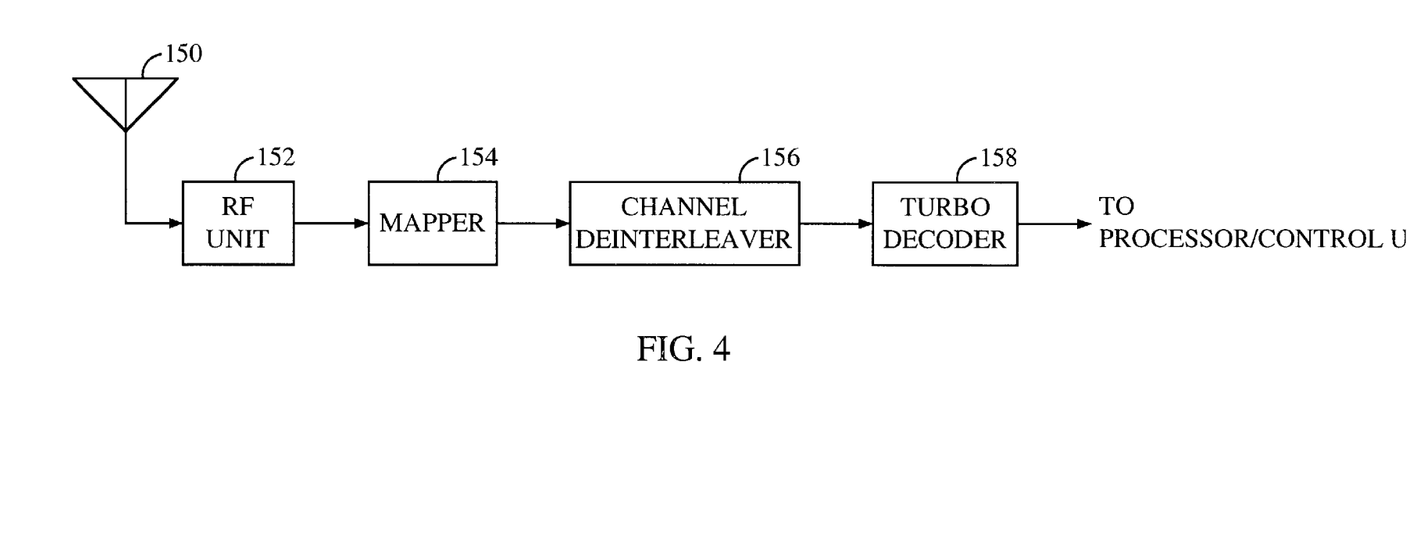
FIG. 4 is a block diagram a receive processing system.

FIG. 4 is a block diagram of a receive system configured in accordance with one embodiment of the invention. Antenna 150 provides the received RF signals to RF unit 152. RF unit performs downconversion, filtering, and digitization of the RF signals. Mapper 140 receives the digitized data and provides soft decision data to channel deinterleaver 156. Turbo decoder 158 decodes the soft decision data from channel deinterleaver 156 and supplies the resulting hard decision data to the processor or control unit at the receive system, which can check the accuracy of the data using the CRC checksum data.

Figure 5:
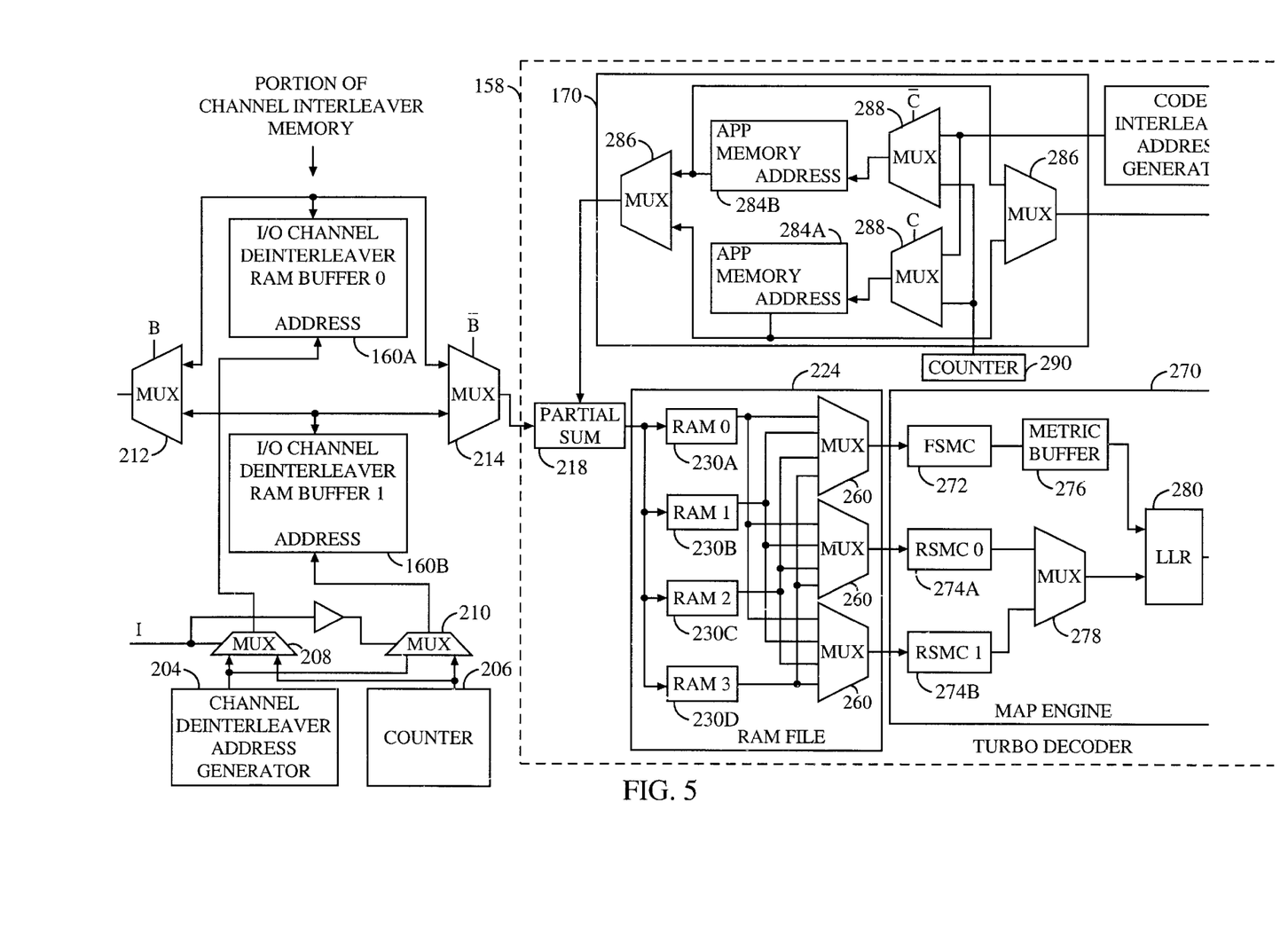
FIG. 5 is a block diagram of decoder and a portion of a channel deinterleaver.

FIG. 5 is a block diagram of turbo decoder 158 and a portion of the channel deinterleaver when configured in accordance with one embodiment of the invention. As shown, the turbo decoder 158 is configured for decoding the data from the turbo coder shown in FIG. 3A.

In the described embodiment, two banks of channel interleaver memory are provided—channel deinterleaver RAMs 160*a* and 160*b*—with each bank capable of storing one channel interleaver block. The address input of the two channel interleaver memory banks are controlled by channel address generator 204 and counter 206, which are applied to the address inputs via multiplexers 208 and 210. Multiplexers 208 and 210 are controlled by signal I and !I (the logical inverse of I), and therefore when one channel deinterleaver RAM is controller by channel deinterleaver address generator 204 the other is controlled by counter 206. In general, any control functionality may be provided by a microprocessor running software stored in memory, and by discrete logic circuits, although the use of various other types of control systems are consistent with the use of the invention.

The I/0 ports of channel interleaver memory banks are coupled to multiplexers 212 and 214. Multiplexer 212 receives the soft decision data from mapper 140 to one of the two channel deinterleaver memory banks. Multiplexer 214 outputs the soft decision data stored in one of the two channel deinterleaver memory banks to partial sum 218. Multiplexors 212 and 214 are controlled by signal B and !B respectively, and therefore when one channel deinterleaver RAM is receiving samples from mapper 140, the other is outputting samples to partial sum 218.

During operation, channel deinterleaver address generator 204 is applied to the channel deinterleaver memory bank receiving sample from mapper 140. Channel deinterleaver address generator generates addresses in inverse order with respect to the interleaving performed by channel interleaver 78 of FIG. 3. Thus, the samples are read into the channel deinterleaver memory bank 160 in non interleaved order (non interleaved with respect to the channel interleaver).

Counter 206 is applied to the channel deinterleaver memory bank reading out the soft decision to partial sum 218. Since the soft decision data was read in inverse order, the soft decision data may be read out in deinterleaved order simply using counter 206. Various other methods of buffering the soft decision data may also be used, including the use of dual-port memory. Also, other method of generating the deinterleaver addresses may be used, including switching counter 206 and channel deinterleaver address generator 204.

Within turbo coder 158, partial sum 218 receives the receive estimates (soft decision data) from the channel deinterleaver as well as a priori probability (APP) data from APP memory 170. As is well known, the APP values are the estimates of the data transmitted based on the previous decoding iteration. During the first iteration, the APP values are set to an equal probability state.

The estimates from the channel deinterleaver memory include estimates of the systematic symbol as well as estimates of two parity symbols for each data bit associated with the channel interleaver block. Partial sum 218 adds the APP value to the systematic symbol, to create a "refined systematic estimate." The refined systematic estimate, along with the two party symbol estimates, are read into RAM file 224.

Within RAM file 224, the estimation values are written into window RAMs 230*a*—*d* (labeled RAM 0–RAM 3). In one embodiment of the invention, the estimates are written in sequential order into the address space of RAMs 0–3. This process starts with RAM 0, and proceeds through RAM 3. At any given time, only one window RAM is written to. The three remaining window RAMs (those not being written to) are applied to (read by) MAP engine 270 via multiplexers 260 as described in greater detail below.

In one embodiment of the invention, a sliding window architecture is employed for performing the map decoding. A system and method for performing this sliding window decoding is described in copending US patent application Ser. No. 08/743,688 entitled "Soft Decision Output Decoder for Decoding Convolutionally Encoded Codewords" assigned to the assignee of the present invention and incorporated herein by reference.

In that application, the MAP decoding is performed on "windows" of data. In the described embodiment of the invention, RAM window banks 230 are L×q in size, where L is the number of transmitted data bits in the window and q is the number of memory bits necessary to store the estimates of the refined systematic symbol and the two parity symbols generated for each data bit. In one embodiment of the invention, six (6) bits are used for the two parity symbol estimates and seven (7) bits are used for the refined systematic symbol estimates (which as described above is the summation of the receive systematic symbol estimate and the APP value), for a q of eighteen (18) bits.

As noted above, the estimates, including the refined systematic symbol estimate and the parity symbol estimates, are written into window RAMs 230*a*–*d* in sequential order. Typically, only one window RAM 230 is being written to, and the remaining three window RAMs 230 are read by MAP engine 270.

In an exemplary processing, data from a new channel block is first written into window RAM 230*a* and then window RAM 230*b*. Thus, window RAM 230*a* contains the first L (1L) set of estimates (where a set comprises the refined systematic estimate and the two parity estimates) and window RAM 230*b* contains the second L (2L) set of estimates. Upon storing the first two sets of L estimates within window RAMs 230, multiplexers 260 begin to apply the data stored in window RAMs 230 into the state metric calculators (SMC) within maximum a prior (MAP) decoder 270. In one embodiment of the invention, the three SMCs are comprised of a forward SMC (FSMC) 272 and two reverse SMCs (RSMC) 274*a* and 274*b*.

As data continues to be written into RAM file 224, multiplexers 260 apply the estimates stored in the three of the four window RAMs to the three state metric calculators within MAP decoder 270 in accordance with Table I.

TABLE I

| Time SMC | 1L | 2L | 3L | 4L | 5L | 6L | 7L | 8L |
|---|---|---|---|---|---|---|---|---|
| FSMC | | RAM 0<br>0->L-1 | RAM 1<br>L->2L-1 | RAM 2<br>2L->3L-1 | RAM 3<br>3L->4L-1 | RAM 0<br>4L->5L-1 | RAM 1<br>5L->6L-1 | |
| RSMC 0 | | RAM1<br>2L-1->L | RAM 0<br>L-1->0 | RAM 3<br>4L-1->3L | RAM 2<br>3L-1->2L | RAM 1<br>6L-1->5L | RAM 0<br>5L-1->4L | |
| RSMC 1 | | | RAM 2<br>3L-1->2L | RAM 1<br>2L-1->L | RAM 0<br>5L-1->4L | RAM 3<br>4L-1->3L | | RAM 1<br>6L-1->5L |
| LLR | | | | | | | | |

Along with the particular window RAM applied to the particular state metric, Table I also lists the set of estimates contained in that window RAM at the time, and therefore the estimates processed by the corresponding SMC.

A window is processed once in the forward direction and once in the reverse direction in accordance with MAP processing. Additionally, most windows are processed an additional time in the reverse direction to generate an initialization state for the other reverse state metric processing. In Table I., the initialization passes are denoted by the italicized text. In the described embodiment, each set of estimates is processed three times, and therefore the window RAM in which the estimates are stored is accessed three times as well. Using 3 window RAMs prevents RAM contention.

As also shown by Table I, at any particular time at least one window RAM is not coupled to any SMC, and therefore is available to have new data written in. By having more that three windows of RAM within RAM file 224, data can be continuously and repeatedly feed to MAP engine in the correct sequence, and to the correct one of the three SMCs, while simultaneously received from channel interleaver memory 160 via partial sum 218.

It should also be noted that Table I illustrates the coupling performed for six (6) windows of data. Thus, the exemplary channel interleaver block size is 6L, and the channel deinterleaver memory is 6L×q. The channel block size of 6L is for example only, and the typical channel block size will be larger than 6L.

Still referring to FIG. 5, within MAP decoder 270, FSMC 272 receives the estimates from RAM file 224 as described above and calculates forward state metric values over a window L. The forward state metric values are stored in metric buffer 276. Additionally, according to Table I, one RSMC 274 calculates reverse state metric values over a another window L. In one embodiment of the invention, each state metric calculator contains its own branch metric calculator. In other embodiments of the invention a single time shared branch metric calculator may be used on the set of state metrics, preferably in combination with a branch metric buffer.

In one embodiment of the invention, the MAP decoder used is a log-MAP decoder, which operates on the logarithm of the estimates to reduce the hardware complexity. One implementation of a log-MAP decoder including state metric and branch metric calculators is described in the reference S.S. Pietrobon, "Implementation and Performance of a Turbo/MAP Decoder," submitted to the *International Journal of Satellite Communications*, February 1997. The log-MAP decoder of Pietrobon does not use the sliding window architecture described in the above referenced "Soft Decision Output Decoder for Decoding Convolutionally Encoded Codewords" patent application.

The last value calculated by the first RSMC 274 is used to initialize the other RSMC 274, which performs a reverse state metric calculation on the window L for which forward state metrics have already been calculated and stored in metric buffer 276. As the reverse state metrics are calculated, they are forwarded, via multiplexer 278, to the log likelihood ratio (LLR) calculator 280. LLR calculator 280 performs a log likelihood calculation of the reverse state metrics received from mux 278 and the forward state metrics stored in metric buffer 276. The resulting data estimates from LLR 280 are forwarded to APP memory 170.

By using a sliding metric calculation process, the amount of memory used to perform the necessary processing is reduced. For example, the set of window RAMs 230 need only be as large as the window L, rather than the size of the entire interleaver block. Similarly, only one window L of forward state metrics need to be stored within metric buffer 276 at any given time. This reduces circuit size significantly.

Additionally, the use of three metric calculators significantly increases the rate at which decoding can be performed. The rate is increased, because the initialization and decoding functions can be performed in parallel. Initialization increases the accuracy of the decoder.

In alternative embodiments of the invention, two forward state metric calculators may be used in conjunction with one reverse state metric calculator. Also, fewer state metric calculators may be used if clocked at a sufficiently high rate to perform twice as many operations. However, increasing the clock rate increases power consumption which is undesirable in many instances including in mobile or battery powered communication systems.

Additionally, while the use of RAM file 224 reduces circuit area and RAM contention within the decoder, other embodiments of the invention may select alternative memory architectures.

As described above with reference to the exemplary embodiment, the decoding is done by performing a first decoding a first window in first direction and simultaneously performing a second decoding on a second window in second direction. The second direction is preferably the opposite of the first direction.

The results of the first decoding are stored. The results of the second decoding are used to initialize a third decoding performed on the first window in the second direction. During the third decoding, the LLR values are calculated using the values calculated during the third decoding and the stored values.

Simultaneous with the third decoding, a forth decoding of another window is performed in the first direction, as well as a fifth decoding in the second direction on still another window. The results of the forth decoding are stored, and the fifth decoding is used to generate an initialization value. These steps are repeated until the entire channel interleaver block is decoded.

Various alternative embodiments of the invention may omit some of the steps used in the described embodiment.

However, the use of the set of steps described provides rapid and accurate decoding with a minimum of memory and additional circuitry, and therefore provides significant performance benefits.

In one embodiment of the invention, APP memory 170 is comprised of two APP memory banks 284. Multiplexers 286 switch each memory bank 284 between being read by partial sum 218, and being written to by LLR 280 to provide double buffered operation. Multiplexers 288 apply either a counter 290 or the code interleaver address generator 292 so as to perform turbo code interleaving and inverse interleaving for each iteration of decoding.

Also, APP memory banks 284 may be large enough to hold all the data estimates for one channel interleaver block, where the estimates are of the data transmitted and not the parity symbols. Estimates of six bits resolution may be used.

The entire decoding process proceeds by repeatedly reading out the receive estimates from a channel deinterleaver buffer 160 and processing with the APP values from APP memory bank 170. After a series of iterations, the estimates should converge on a set of values that are then used for generating hard decisions. The results of the decoding are then checked using the CRC values. Simultaneous with the decoding, the other channel deinterleaver buffer receives the next block of receive estimates.

Figure 6:
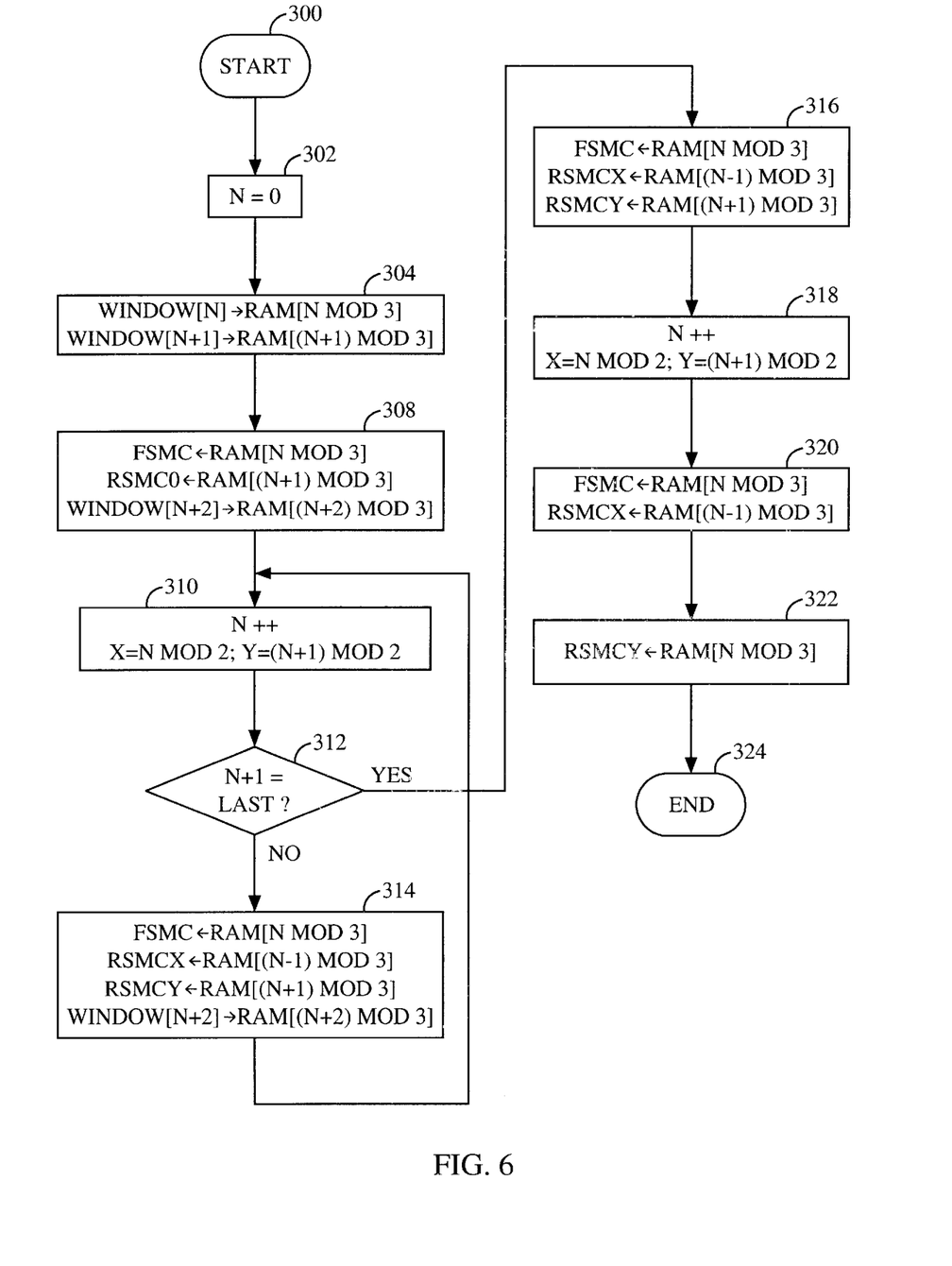
FIG. 6 is a flow chart illustrating an exemplary set of decoding steps.

FIG. 6 is a flow chart illustrating the steps performed during log-MAP decoding of a channel interleaver block in accordance with one embodiment of the invention. The steps are discussed with reference to the elements shown in FIG. 5.

The decoding begins at step 300 and at step 302 window index N is set to 0. At step 304 window[N] and window[N+1] of the estimates stored in channel deinterleaver RAM are written into window RAM[N mod 3] and window RAM[(N+1) mod 3] respectively. As noted above, a window of estimates corresponds to the symbols generated with respect to a window L of data bits being transmitted.

At step 308, FSMC processes the estimates in RAM[N mod 3] (which in this case is RAM 0) and RSMC 0 processes the estimates in RAM[(N+1) mod 3] (which is RAM 1). Additionally, window[N+2] of estimates from the channel deinterleaver RAM is written into window RAM [(N+2) mod 3] (which is RAM 2).

At step 310, window index N is incremented and X is set to N mod 2 and Y is set to (N+1) mod 2. At step 312 it is determined whether N+1 corresponds to the last window of estimates to be processed. If not, step 314 is performed.

At step 314, FSMC processes the estimates stored in window RAM[N mod 3], RSMC X (X=0 in the first pass) processes the estimates stored in window RAM[(N+1) mod 3], and RSMC Y (Y=1 in the first pass) processes the estimates stored in window RAM[(N−1) mod 3]. Additionally, window[N+2] of estimates from channel deinterleaver RAM are written to window RAM[(N+2) mod 3].

Not shown, is that a set of APP values corresponding to window[N−1] of data are generated at step 314 during the processing performed by RSMC 1. By performing the decoding over windows, the size of the metric buffer is kept to length L times the number of metrics generated for each decoding step. Since numerous metrics are stored for each decoding step, the reduction in metric memory is significant as compared to storing the state metrics for the entire channel deinterleaver block.

Additionally, the use of the second reverse state metric calculator increases speed and accuracy. For example, the second RSMC can calculate a new initial value for the next decoding window while the previous decoding window is being processed. Calculating this new initial value eliminates the need to perform new RSMC calculations for each decoding step, as the new value can be used for decoding all of the previous window.

Step 314 provides an excellent illustration of the efficiencies gained by processing the estimates as exemplified by RAM file 224. In particular, step 314 illustrates the ability to perform four steps in the decoding processing simultaneously. This increases the rate at which coding can be performed for a given clock rate. In the described embodiment, the steps include the state metric calculation processing and the writing of additional samples to RAM file 224. Also, the APP values are calculated during step 314.

Once step 314 is completed, the window index N is incremented at step 310. If the value N+1 is equal to the last window, then the pipeline processing is discontinued, and the remaining estimates within RAM file 224 are processed at steps 316 through 322.

In particular, at step 316 the FSMC processes window RAM[N mod 3], RSMC X processes window RAM[(N+1) mod 3] and RSMC Y processes window RAM[(N+1) mod3]. At step 318 window index N is incremented, X is set to N mod 2 and Y is set to (N+1) mod 2. At step 320 FSMC processes RAM[N mod 3] and RSMC Y processes RAM [(N−1) mod 3]. At step 322 RSMC 1 processes RAM[N mod 3]. At step 324 the channel deinterleaver block has been completed at the processing terminates.

Thus, a novel and improved technique for performing turbo coding has been described.

What is claimed is:

1. A system for decoding comprising:
 a) channel deinterleaver RAM for storing a block of symbol estimates;
 b) set of S state metric calculators, each state metric calculator for enerating a set of state metric calculations;
 c) set of S+1 window RAMs, wherein,
  S of said S+1 window RAMs provide symbol estimates to said S state metric calculators, and A remaining window RAM receives symbol estimates from said channel deinterleaver RAM.

2. The system as set forth in claim 1 wherein S is equal to 3.

3. The system as set forth in claim 1 wherein said window RAMs are significantly smaller than said channel deinterleaver RAM.

4. The system as set forth in claim 1 wherein said state metric calculators process data over windows equal to or less than the size of a window RAM.

5. A decoder comprising:
 channel interleaver memory for storing a channel interleaver block of receive estimates;
 decoder engine for decoding receive estimates;
 decoder buffer for simultaneously reading out a first set of receive estimates and a second set of receive estimates to said decoder engine and writing in a third set of receive estimates from said channel interleaver memory.

6. The decoder as set forth in claim 5 wherein said decoder buffer is further for simultaneously reading out a fourth set of receive estimates.

7. The decoder as set forth in claim 5 wherein said decoder engine is a MAP decoder engine.

8. The decoder as set forth in claim 5 wherein said decoder engine is comprised of:
- forward state metric calculator for generating forward state metrics in response to said first set of receive estimates;
- reverse state metric calculator for generating reverse state metrics in response to said second set of receive estimates.

9. The decoder as set forth in claim 6 wherein said decoder engine is further comprised of:
- forward state metric calculator for generating forward state metrics in response to said first set of receive estimates;
- first reverse state metric calculator for generating reverse state metrics in response to said second set of receive estimates; and
- second reverse state metric calculator for generating reverse state metrics in response to said fourth set of receive estimates.

10. The decoder as set forth in claim 5 wherein said decoder buffer is comprised of:
- first memory for reading and writing receive samples;
- second memory for reading and writing receive samples; and
- third memory for reading and writing receive samples.

11. A method for decoding data comprising the steps of:
- a) coupling a first state metric calculator to a first set of receive estimates to generate an initialization value;
- b) coupling a second state metric calculator to a second set of receive estimates to generate a first set of state metrics;
- c) coupling a third state metric calculator to a third set of receive estimates to generate a second set of state metrics;
- d) writing a fourth set of receive estimates to a data buffer, wherein
  steps a, b, c, and d are performed simultaneously.

12. The method as set forth in claim 11 wherein said second set of state metrics are generating using a previously calculated initialization values, and are processed with a previously calculated set of state metrics to generate data estimates.

13. The method as set forth in claim 11 further comprising the steps of:
- coupling said first state metric calculator to said second set of receive estimates; and
- coupling said third state metric calculator to said first set of receive estimates.

14. A method for decoding comprising the steps of:
- a) performing a first decoding a first window in first direction and simultaneously performing a second decoding on a second window in second direction;
- b) storing results of the first decoding;
- c) initialize a third decoding using a result from the second decoding;
- d) performed a third decoding on said first window in said second direction, and calculating LLR values using metrics calculated during the third decoding and said results; and
- simultaneous with step d)
  - performing a forth decoding, a fifth decoding of another window in the first direction, as well as a sixth decoding in the second direction on new window;
- e) storing fifth decoding results from said fifth decoding, using sixth decoding results for an initialization value.

15. The method as set forth in claim 14, wherein said second direction is opposite of said first direction.

* * * * *